United States Patent
Jung et al.

(10) Patent No.: US 11,130,770 B2
(45) Date of Patent: Sep. 28, 2021

(54) PRECURSOR COMPOUND FOR PRODUCING PHOTOACTIVE LAYER OF THIN FILM SOLAR CELL AND PRODUCTION METHOD THEREOF

(71) Applicant: Research & Business Foundation Sungkyunkwan University, Suwon-si (KR)

(72) Inventors: Duk Young Jung, Seongnam-si (KR); Hyun Jong Lee, Seoul (KR); Ji Hyun Cha, Incheon (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/804,141

(22) Filed: Feb. 28, 2020

(65) Prior Publication Data

US 2020/0277311 A1     Sep. 3, 2020

(30) Foreign Application Priority Data

Feb. 28, 2019   (KR) .......................... 10-2019-0023940

(51) Int. Cl.
  *C07F 1/00*     (2006.01)
  *H01L 31/055*   (2014.01)

(52) U.S. Cl.
  CPC ............ *C07F 1/005* (2013.01); *H01L 31/055* (2013.01)

(58) Field of Classification Search
  None
  See application file for complete search history.

(56) References Cited

PUBLICATIONS

Hendrickson et al. Inorganic Chemistry, vol. 15, No. 9, 1976, 2115-2119.*
Ly et al. Sensors 2017, 17, 2628, 1-11.*

* cited by examiner

*Primary Examiner* — Clinton A Brooks
(74) *Attorney, Agent, or Firm* — NSIP Law

(57) ABSTRACT

Disclosed a precursor compound for producing a photoactive layer of a thin film solar cell that may be used as a precursor of a CIS, CGS or CIGS thin film that may be used as a photoactive layer of a solar cell, and a production method thereof. The precursor compound is represented by a following Chemical Formula 1:

[Chemical Formula 1]

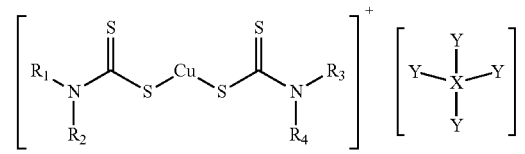

wherein, in the Chemical Formula 1, X represents indium (In) or gallium (Ga), Y represents chlorine (Cl) or iodine (I), each of $R_1$, $R_2$, $R_3$ and $R_4$ independently represents a methyl group, a propyl group or an alkyl group having 2 to 10 carbon atoms.

13 Claims, 3 Drawing Sheets

[FIG. 1]
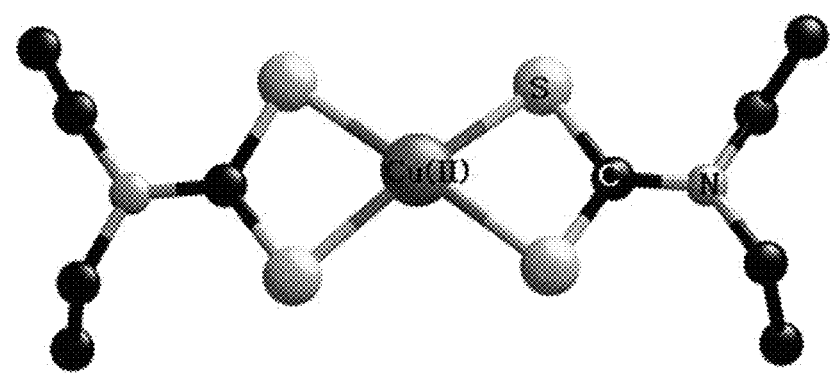
[FIG. 2]
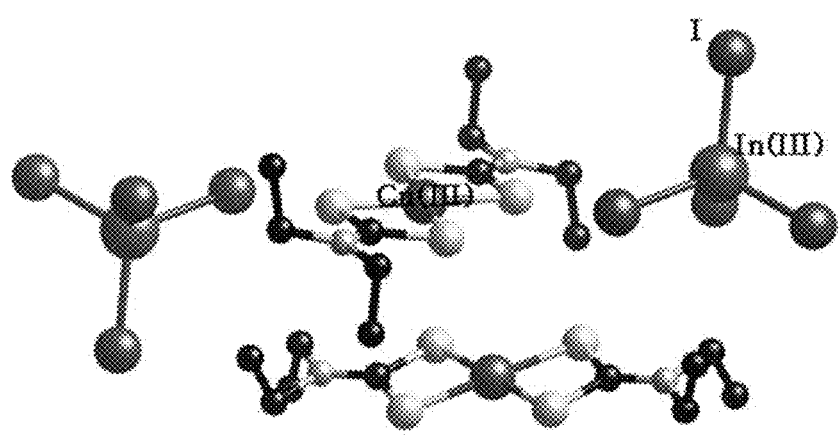

[FIG. 3]
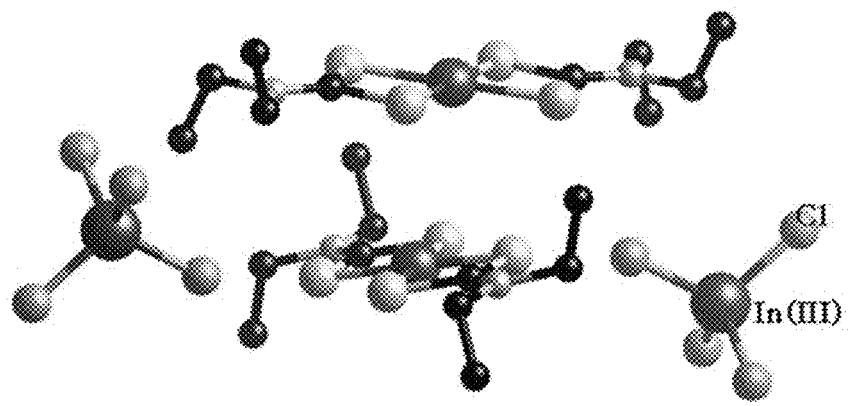
[FIG. 4]
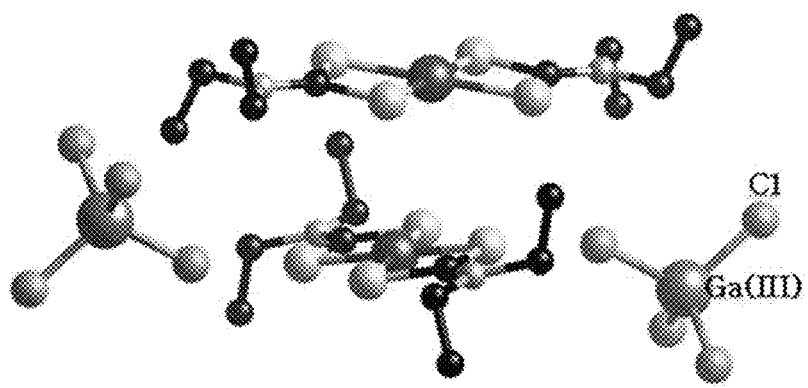

[FIG. 5]
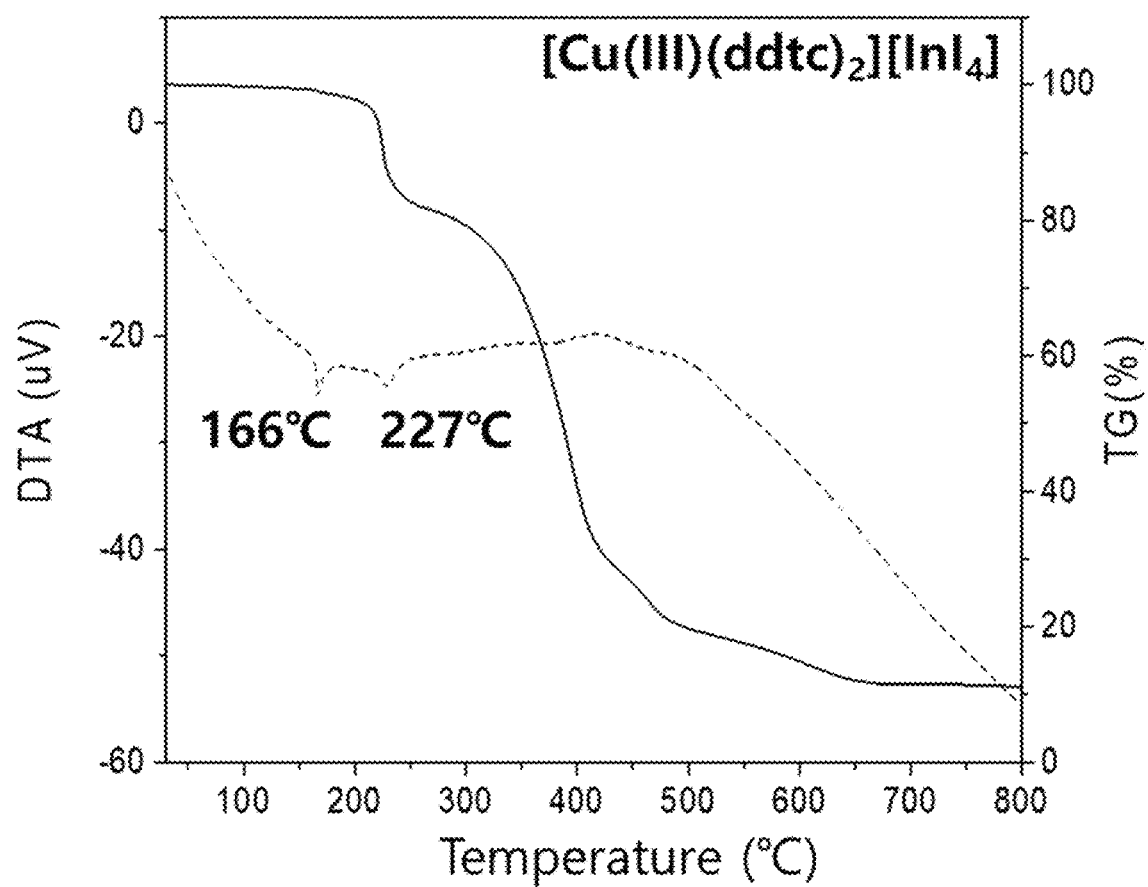

PRECURSOR COMPOUND FOR PRODUCING PHOTOACTIVE LAYER OF THIN FILM SOLAR CELL AND PRODUCTION METHOD THEREOF

CROSS-REFERENCE TO RELATED APPLICATION

This application claims the benefit under 35 U.S.C. § 119(a) of Korean Patent Application No. 10-2019-0023940 filed on Feb. 28, 2019, in the Korean Intellectual Property Office, the entire disclosure of which is incorporated herein by reference for all purposes.

BACKGROUND

1. Field

The present disclosure relates to a precursor compound for producing a photoactive layer of a thin film solar cell. More specifically, the present disclosure relates to a precursor compound for producing a photoactive layer of a thin film solar cell that may be used as a precursor of a CIS, CGS or CIGS thin film that may be used as a photoactive layer of a solar cell, and to a production method thereof.

2. Description of Related Art

A CIGS thin film type solar cell is a solar cell having a layer made of $CuInGaS(Se)_2$ as an inorganic crystal called chalcopyrite as a thin film type photoactive layer. The CIGS thin film type solar cell is excellent in stability. A size of a band gap of the film thereof may be adjusted by varying an arrangement and a size of a nano-structured material of the thin film. Thus, efficiency of the CIGS thin film type solar cell is higher.

The efficiency of the CIGS thin film type solar cell is steadily upgraded, and a cycle of the upgrade is getting shorter. Thus, in 2017, a standard energy conversion efficiency thereof was 22.3%.

The CIGS thin film may be synthesized in high vacuum and produced as a highly efficient solar cell. However, there is a problem that the CIGS thin film is not economical due to a high process cost.

Dithiocarbamate (dtc) is a sulfide organic compound in which carbon disulfide is bonded to a nitrogen site of amine. The carbon disulfide is toxic and flammable. However, the sulfide organic is free of these problems and are usefully used as a sulfur source.

In particular, the dithiocarbamate (dtc) is combined with a metal in aqueous solution to easily from a complex. Therefore, a method of fabricating a photoactive layer using a solution containing a metal-dtc complex has been studied. However, there is still a disadvantage that the solution is unstable.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a precursor compound for producing a photoactive layer of a thin film solar cell, in which the precursor compound contains copper (Cu), and sulfur (S), and indium (In) or gallium (Ga) and may be used as a precursor for a CIS, CGS or CIGS thin film that may be used as a photoactive layer of a solar cell.

Another purpose of the present disclosure is to provide a production method of a precursor compound for producing a photoactive layer of a thin film solar cell.

Purposes of the present disclosure are not limited to the above-mentioned purpose. Other purposes and advantages of the present disclosure as not mentioned above may be understood from following descriptions and more clearly understood from embodiments of the present disclosure. Further, it will be readily appreciated that the purposes and advantages of the present disclosure may be realized by features and combinations thereof as disclosed in the claims.

A precursor compound for producing a photoactive layer of a thin film solar cell for achieving one purpose of the present disclosure is represented by a following Chemical Formula 1:

[Chemical Formula 1]

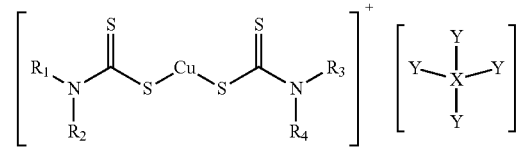

In the Chemical Formula 1, X represents indium (In) or gallium (Ga), Y represents chlorine (Cl) or iodine (I), $R_1$, $R_2$, $R_3$ and $R_4$ are the same as or different from each other, and each of $R_1$, $R_2$, $R_3$ and $R_4$ represents a methyl group, a propyl group or an alkyl group having 2 to 10 carbon atoms.

Further, the precursor compound may be selected from a group consisting of following Chemical Formulas 2 to 4:

$[CuC_{10}H_{20}N_2S_4][InI_4]$      [Chemical Formula 2]

$[CuC_{10}H_{20}N_2S_4][InCl_4]$      [Chemical Formula 3]

$[CuC_{10}H_{20}N_2S_4][GaCl_4]$      [Chemical Formula 4]

A production method of a precursor compound for producing a photoactive layer of a thin film solar cell to achieve another purpose of the present disclosure includes reacting a copper precursor and a sulfide-based organic material in a solution to form a copper complex compound; dissolving a metal halide represented by a following Chemical Formula 5 in a solvent to produce a reaction solution; and mixing the copper complex compound with the reaction solution:

[Chemical Formula 5]

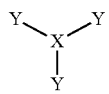

In the Chemical Formula 5, X represents indium (In) or gallium (Ga), and Y represents chlorine (Cl) or iodine (I).

In one embodiment, the copper precursor may include copper chloride ($CuCl_2$).

Further, the sulfide-based organic material may include a ligand represented by a following Chemical Formula 6 or Chemical Formula 7. For example, the sulfide-based organic material may be diethyldithiocarbamate ($C_5H_{10}NS_2$):

[CuC$_6$H$_{12}$N$_2$S$_4$]  [Chemical Formula 6]

[CuC$_{10}$H$_{14}$N$_2$S$_4$]  [Chemical Formula 7]

Further, in forming the copper complex compound, the copper precursor and the diethyldithiocarbamate (ddtc, C$_5$H$_{10}$NS$_2$) may react with each other at a molar ratio of 1:2.

In one example, the metal halide may include one selected from InI$_3$, InCl$_3$, and GaCl$_3$.

Further, the organic solvent may include one or more selected from a group consisting of benzene, acetone and methylene chloride.

In the mixing step, the metal halide and the copper complex compound may react with each other at a molar ratio of 1:1.

Further, the mixing may be carried out at 15 to 25° C. for 10 hours inclusive to 24 hours inclusive.

Further, after the step of mixing, the method may further include dissolving the produced precursor compound in solvent. In this connection, the organic solvent may include methylene chloride.

Effects in accordance with the present disclosure may be as follows but may not be limited thereto.

The precursor compound in accordance with the present disclosure contains copper (Cu), and sulfur (S), and indium (In) or gallium (Ga) and may be used as a precursor for a CIS thin film or a CGS thin film that may be used as a photoactive layer of a solar cell. Alternatively, the precursor compound containing indium (In) and the precursor compound containing gallium (Ga) may be mixed with each other in a ratio of 1:1 to realize the CIGS thin film. This may produce a high efficiency solar cell at low cost.

Further, the present disclosure allows simple synthesis of a dissimilar metal complex compound at room temperature using the sulfide-based organic material and the halogen element. A solution obtained by dissolving the metal complex compound in a highly volatile methylene chloride may be used produce a photoactive layer of a thin film solar cell. Thus, The coating may be performed at room temperature, thereby reducing a cost resulting from vacuum deposition equipment, and facilitating a large-area production.

In addition, in accordance with the present disclosure, the molecule itself is used as as a precursor, there is an advantage in terms of convenience in that nanoparticles that may have relative difficulty in synthesizing thereof may be omitted.

In addition to the effects as described above, specific effects in accordance with the present disclosure will be described together with the detailed description for carrying out the disclosure.

BRIEF DESCRIPTION OF DRAWINGS

FIG. 1 is a cross-sectional view showing a molecular structure of a copper-ddtc complex compound in which copper is bonded to ddtc according to an embodiment of the present disclosure.

FIG. 2 is a cross-sectional view illustrating a molecular structure of a copper-ddtc.indium tetraiodide single precursor according to an embodiment of the present disclosure.

FIG. 3 is a cross-sectional view illustrating a molecular structure of a copper-ddtc.indium tetrachloride single precursor according to another embodiment of the present disclosure.

FIG. 4 is a cross-sectional view illustrating a molecular structure of a copper-ddtc.gallium-tetrachloride single precursor according to still another embodiment of the present disclosure.

FIG. 5 is a graph showing a differential thermal weight analysis result of a copper-ddtc.indium tetraiodide single precursor according to an embodiment of the present disclosure.

DETAILED DESCRIPTIONS

In the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

One purpose of the present disclosure is to provide a precursor compound for producing a photoactive layer of a thin film solar cell, in which the precursor compound contains copper (Cu), and sulfur (S), and indium (In) or gallium (Ga) and may be used as a precursor for a CIS, CGS or CIGS thin film that may be used as a photoactive layer of a solar cell.

A precursor compound for producing a photoactive layer of a thin film solar cell in accordance with one aspect of the present disclosure is represented by a following Chemical Formula 1:

[Chemical Formula 1]

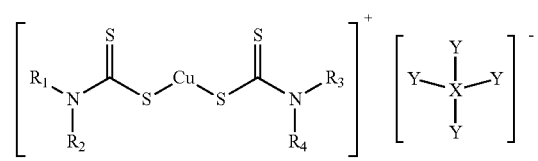

In the Chemical Formula 1, X represents indium (In) or gallium (Ga), Y represents chlorine (Cl) or iodine (I), $R_1$, $R_2$, $R_3$ and $R_4$ are the same as or different from each other, and each of $R_1$, $R_2$, $R_3$ and $R_4$ represents a methyl group, a propyl group or an alkyl group having 2 to 10 carbon atoms.

Further, the precursor compound may be selected from a group consisting of following Chemical Formulas 2 to 4:

[CuC₁₀H₂₀N₂S₄][InI₄]  [Chemical Formula 2]

[CuC₁₀H₂₀N₂S₄][InCl₄]  [Chemical Formula 3]

[CuC₁₀H₂₀N₂S₄][GaCl₄]  [Chemical Formula 4]

Further, a production method of a precursor compound for producing a photoactive layer of a thin film solar cell in accordance with a second aspect of the present disclosure includes reacting a copper precursor and a sulfide-based organic material in an aqueous solution to form a copper complex compound; dissolving a metal halide represented by a following Chemical Formula 5 in solvent to produce a reaction solution; and mixing the copper complex compound with the reaction solution:

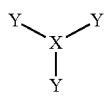

[Chemical Formula 5]

In the Chemical Formula 5, X represents indium (In) or gallium (Ga), and Y represents chlorine (Cl) or iodine (I).

First, the copper complex compound is formed by reacting the copper precursor and the sulfide-based organic material in solution. In this connection, the copper precursor is preferably copper chloride ($CuCl_2$). Further, the sulfide-based organic material may include a ligand represented by a following Chemical Formula 6 or Chemical Formula 7.

[CuC₆H₁₂N₂S₄]  [Chemical Formula 6]

[CuC₁₀H₁₄N₂S₄]  [Chemical Formula 7]

For example, the sulfide-based organic material may be diethyldithiocarbamate ($C_5H_{10}NS_2$) which is easily combined with a metal in solution to form a complex.

Further, in synthesizing the copper complex compound, the copper precursor and the diethyldithiocarbamate ($C_5H_{10}NS_2$) is reacted with each other at a molar ratio of 1:2, so that the copper-ddtc complex represented by a following Chemical Formula 8 may be easily synthesized.

[CuC₁₀H₂₀N₂S₄]  [Chemical Formula 8]

Specifically, referring to FIG. 1, the copper of the copper-ddtc complex compound may have various oxidation numbers. In a copper complex compound in which sulfur is coordinated therewith, various oxidation numbers may be taken in a more stable form.

That is, the copper complex compound may guarantee various oxidation numbers. The copper complex compound may be synthesized and converted to a dissimilar metals complex compound. Since the copper element as a precursor may be stably kept in the air, the copper may function as a material for the copper precursor or a dissimilar metals material.

Next, the metal halide represented by the Chemical Formula 5 is dissolved in the organic solvent to produce the reaction solution.

In one example, the metal halide may include one selected from $InI_3$, $InCl_3$, and $GaCl_3$.

Further, the organic solvent preferably contains at least one selected from the group consisting of benzene, acetone and methylene chloride.

Specifically, for $InI_3$, benzene is used as the organic solvent; for $InCl_3$, an organic solvent employs a mixture of acetone and methylene chloride; for $GaCl_3$, methylene chloride is more preferably used as the organic solvent.

Thereafter, mixing the copper complex compound and the reaction solution proceeds.

The mixing is performed at 15 to 25° C., preferably, at room temperature, for about 10 hours or more and less than 24 hours, and the metal halide and the copper complex compound react with each other at a molar ratio of 1:1.

When the copper complex compound and the reaction solution are mixed with each other at room temperature for 10 hours or more, the copper is oxidized. Thus, the precursor compound for producing the photoactive layer of the thin film solar cell represented by the Chemical Formula 2, the Chemical Formula 3, or the Chemical Formula 4 may be produced in a powder form.

Further, after the mixing step, the step of dissolving the produced precursor compound in the organic solvent may be further proceeded. In this connection, the organic solvent is preferably methylene chloride. This is because the precursor compound according to the present disclosure not only has high solubility in the methylene chloride but also has a high volatility, so that a solution containing the precursor compound may be coated at room temperature to produce a thin film of a solar cell.

In one embodiment, in the precursor compound for producing the photoactive layer of the thin film solar cell in accordance with the present disclosure, the copper of the copper-ddtc complex compound is oxidized to be trivalent and thus is present as a molecular cation as shown in FIG. 2 while an indium-iodine quaternary coordination compound is present as an anion. Thus, the precursor compound for producing the photoactive layer of the thin film solar cell in accordance with the present disclosure may be stably formed as a dissimilar metals complex in a form of a salt as a whole.

The precursor compound may serve as a precursor to provide copper (Cu), indium (In) and sulfur (S), which are constituent elements of the CIGS thin film.

Further, a carbon-nitrogen bond of the precursor compound is easily broken during heat treatment, thereby to form an amine group serving as a reducing agent.

Further, the chlorine (Cl) bonded to the indium (In) of the precursor compound serves as an indium carrier, and the bond is easily cut off and thus the Cl is removed during heat treatment.

In another embodiment, in the precursor compound for producing a photoactive layer of the thin film solar cell in accordance with the present disclosure, as shown in FIG. 3, the copper of the copper-ddtc complex while trivalently oxidized and thus present as a molecular cation, while the indium-chlorine quaternary coordination complex is present as an anion. Thus, the precursor compound may be stably formed as a dissimilar metals complex in a form of a salt as a whole.

The precursor compound may serve as a precursor to provide copper (Cu), indium (In) and sulfur (S), which are constituent elements of the CIGS thin film.

Further, the carbon-nitrogen bond of the precursor compound is easily broken during heat treatment, thus to form an amine group serving as a reducing agent.

Further, the chlorine (Cl) bonded to the indium (In) of the precursor compound serves as an indium (In) carrier, and the bond therebetween is easily broken off during the heat treatment and thus Cl blows away and is removed.

In another embodiment, in the precursor compound for producing a photoactive layer of a thin film solar cell according to the present disclosure, as shown in FIG. 4, the copper of the copper-ddtc complex is trivalently oxidized and thus is present as a molecular cation, while the gallium-chlorine quaternary coordination complex is present as an anion. Thus, the precursor compound may be stably formed as a dissimilar metals complex in a form of a salt as a whole.

The precursor compound may serve as a precursor for providing copper (Cu), gallium (Ga) and sulfur (S), which are constituent elements of the CIGS thin film.

Further, the carbon-nitrogen bond of the precursor compound is easily broken during heat treatment, thus to form an amine group serving as a reducing agent.

Further, the chlorine (Cl) bonded to gallium (Ga) of the precursor compound serves as a gallium (Ga) carrier, and the bond therebetween is easily broken during heat treatment and thus the Cl blows away and is removed.

The precursor compound according to an embodiment has a high solubility in an organic solvent, preferably, in methylene chloride. Thus, it is easy to produce the photoactive layer of the solar cells using the precursor compound.

Further, the precursor compound in accordance with the present disclosure contains copper (Cu), and sulfur (S), and indium (In) or gallium (Ga) and may be used as a precursor for a CIS thin film or a CGS thin film that may be used as a photoactive layer of a solar cell. Alternatively, the precursor compound containing indium (In) and the precursor compound containing gallium (Ga) may be mixed with each other in a ratio of 1:1 to realize the CIGS thin film. This may produce a high efficiency solar cell at low cost.

In another example, another embodiment of the present disclosure may include a solar cell production method.

First, the method includes forming a first electrode a substrate. Thereafter, forming a first charge transport layer on the first electrode is performed. Next, forming a photoactive layer on the first charge transport layer is performed. Thereafter, forming a second charge transport layer on the photoactive layer is performed. Finally, forming a second electrode on the second charge transport layer is executed to produce a solar cell.

In this connection, the photoactive layer may be embodied as a CIS thin film or a CGS thin film produced using one precursor compound selected from the following Chemical Formulas 2 to 4:

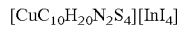  [Chemical Formula 2]

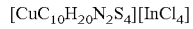  [Chemical Formula 3]

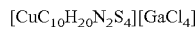  [Chemical Formula 4]

In another example, the photoactive layer may be embodied as a CIGS thin film produced by mixing one selected from the following Chemical Formulas 2 or 3 and the precursor compound represented by the following Chemical Formula 4:

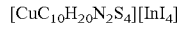  [Chemical Formula 2]

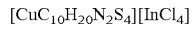  [Chemical Formula 3]

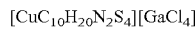  [Chemical Formula 4]

Further, the photoactive layer may be formed by drop casting a solution in which the precursor compound is dissolved in an organic solvent on a substrate in a volume of 0.1 ml, and then drying the solution on the substrate at a temperature of 15 to 25° C., preferably at room temperature.

Hereinafter, the precursor compound for producing the photoactive layer of the thin film solar cell in accordance with the present disclosure, the production method thereof, and the solar cell production method will be described in detail with reference to specific examples.

Example 1: Production of Precursor Compound to Produce Photoactive Layer of Thin Film Solar Cell (1) Synthesis of Cu (III)-ddtc($CuCl_{10}H_{20}NS_4$) Complex 0.01 mmol of copper chloride ($CuCl_2$) and 0.02 mmol of diethyl dithiocarbamate (ddtc) reacted with each other in an aqueous solution to obtain a Cu(III)-ddtc($CuCl_{10}H_{20}NS_4$) complex.

(2) Synthesis of Cu(III)-ddtc.In(III)$I_4$ Precursor Material

After producing a reaction solution by dissolving $InI_3$ 0.01 mmol in a prepared benzene solvent, Cu(III)-ddtc ($CuCl_{10}H_{20}NS_4$) complex as prepared as described above and the reaction solution were mixed with each other and stirred at room temperature for about 10 hours to form Cu(III)-ddtc.In(III)$I_4$ as a precursor compound according to the present disclosure, in a powder form.

Example 2: Production of Precursor Compound to Produce Photoactive Layer of Thin Film Solar Cell Cu(III)-ddtc.In(III)$Cl_4$ as a precursor compound according to the present disclosure was obtained in a powder form in substantially the same manner as in Example 1. except for using $InCl_3$.

Example 3: Production of Precursor Compound to Produce Photoactive Layer of Thin Film Solar Cell Cu(III)-ddtc.Ga(III)$Cl_4$ as a precursor compound in accordance with the present disclosure was obtained in a powder form using substantially the same method as in Example 1 except for using $GaCl_3$.

Example 4: Solar Cell Production

Each solution was prepared in which each of the precursor compound powders as produced in above Examples 1 to 3 was dissolved in 10 ml of methylene chloride.

Next, a first electrode was formed on a ITO substrate. Then, a first transport layer is formed on the first electrode. Each of the solutions of Examples 1 to 3 was dropped cast in a volume of 0.1 ml on the first charge transport layer, and then was left at room temperature to form each photoactive layer.

Thereafter, a second charge transport layer was formed on each photoactive layer, and then a second electrode was formed on the second charge transport layer to produce each solar cell.

Experimental Example 1: Chemical Structure

Chemical structures of Cu(III)-ddtc($CuCl_{10}H_{20}NS_4$) complex compound (see FIG. 1) of Example 1, and Cu(III)-ddtc.In (III)$I_4$, Cu(III)-ddtc.In(III)$Cl_4$ and Cu (III)-ddtc.Ga (III)$Cl_4$ as obtained according to Examples 1 to 3 were identified via spectroscopy using a single crystal X-ray diffractometer and a Fourier transform infrared spectrometer (FTIR), specifically, secondary Nicoleti Z10 module (trade name) available from Thermo Fisher Scientific (company name, USA)) (See FIGS. 2-4).

Experimental Example 2: Measurement of Melting Point and Decomposition Point

A melting point and decomposition point of Cu(III)-ddtc.In(III)I$_4$ as produced according to Example 1 were measured using a thermogravimetric analyzer (TGA). Results are shown in FIG. 5.

Referring to FIG. 5, the melting point of Cu(III)-ddtc.In (III)I$_4$ as produced according to Example 1 was about 227° C., and the decomposition point thereof was about 166° C.

Although the present disclosure is described above with reference to preferred examples of the present disclosure, those skilled in the art may variously modify the present disclosure without departing from the spirit and scope of the present disclosure set forth in the claims below.

What is claimed is:

1. A precursor compound for producing a photoactive layer of a thin film solar cell, wherein the precursor compound comprises a following Chemical Formula 1:

[Chemical Formula 1]

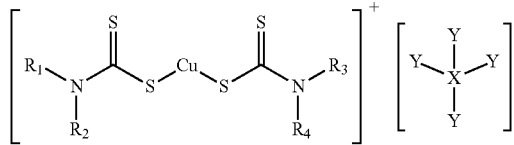

wherein, in the Chemical Formula 1, X is indium (In) or gallium (Ga), Y is chlorine (Cl) or iodine (I), each of R$_1$, R$_2$, R$_3$ and R$_4$ independently are a methyl group, or an alkyl group having 2 to 10 carbon atoms.

2. The precursor compound of claim 1, wherein the precursor compound is selected from the group consisting of [CuC$_{10}$H$_{20}$N$_2$S$_4$][InI$_4$], [CuC$_{10}$H$_{20}$N$_2$S$_4$][InCl$_4$], and [CuC$_{10}$H$_{20}$N$_2$S$_4$][GaCl$_4$].

3. A method for producing the precursor compound for producing a photoactive layer of a thin film solar cell of claim 1, wherein the method comprises:
reacting a copper precursor and a sulfide-based organic material with each other in an aqueous solution to form a copper complex compound;
dissolving a metal halide comprising a following Chemical Formula 5 in solvent to produce a reaction solution; and
mixing the copper complex compound with the reaction solution:

[Chemical Formula 5]

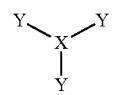

wherein in the Chemical Formula 5, X is indium (In) or gallium (Ga), and Y is chlorine (Cl) or iodine (I), and wherein the precursor compound comprises a following Chemical Formula 1:

[Chemical Formula 1]

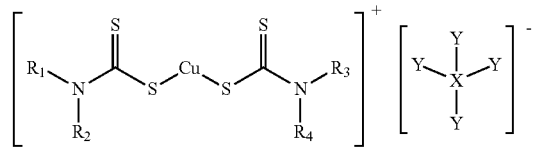

wherein, in the Chemical Formula 1, X is indium (In) or gallium (Ga), Y is chlorine (Cl) or iodine (I), each of R$_1$, R$_2$, R$_3$ and R$_4$ independently are a methyl group or an alkyl group having 2 to 10 carbon atoms.

4. The method of claim 3, wherein the copper precursor comprises copper chloride (CuCl$_2$).

5. The method of claim 3, wherein the sulfide-based organic material comprises a ligand selected from the group consisting of
[CuC$_6$H$_{12}$N$_2$S$_4$] and
[CuC$_{10}$H$_{14}$N$_2$S$_4$].

6. The method of claim 3, wherein the sulfide-based organic material comprises diethyldithiocarbamate (C$_5$H$_{10}$NS$_2$).

7. The method of claim 6, wherein in forming the copper complex compound, the copper precursor and the diethyldithiocarbamate (C$_5$H$_{10}$NS$_2$) reacts with each other at a molar ratio of 1:2.

8. The method of claim 3, wherein the metal halide is selected from the group consisting of InI$_3$, InCl$_3$, and GaCl$_3$.

9. The method of claim 6, wherein the organic solvent is selected from the group consisting of benzene, acetone, methylene chloride, and a mixture thereof.

10. The method of claim 3, wherein the mixing the copper complex compound with the reaction solution comprises reacting the metal halide and the copper complex compound with each other at a molar ratio of 1:1.

11. The method of claim 3, wherein the mixing is carried out at 15 to 25° C. for 10 hours to 24 hours.

12. The method of claim 3, wherein after the mixing, the method further comprises dissolving the produced precursor compound in an organic solvent.

13. The method of claim 12, wherein the organic solvent comprises methylene chloride.

* * * * *